United States Patent
Scheibel et al.

(10) Patent No.: US 11,091,394 B2
(45) Date of Patent: Aug. 17, 2021

(54) COMPOSITION FOR PRODUCING AN AQUEOUS COATING MASS

(71) Applicant: Heraeus Deutschland GmbH & Co. KG, Hanau (DE)

(72) Inventors: Markus Scheibel, Hanau (DE); Tamara Draskovic, Rodgau (DE)

(73) Assignee: HERAEUS DEUTSCHLAND GMBH & CO. KG, Hanau (DE)

( * ) Notice: Subject to any disclaimer, the term of this patent is extended or adjusted under 35 U.S.C. 154(b) by 5 days.

(21) Appl. No.: 16/629,839

(22) PCT Filed: Mar. 2, 2018

(86) PCT No.: PCT/EP2018/055132
§ 371 (c)(1),
(2) Date: Jan. 9, 2020

(87) PCT Pub. No.: WO2019/025033
PCT Pub. Date: Feb. 7, 2019

(65) Prior Publication Data
US 2021/0087111 A1    Mar. 25, 2021

(30) Foreign Application Priority Data

Jul. 31, 2017  (EP) .................................... 17183915
Nov. 8, 2017   (EP) .................................... 17200559

(51) Int. Cl.
| | | |
|---|---|---|
| C04B 22/16 | (2006.01) | |
| C04B 14/04 | (2006.01) | |
| C04B 14/06 | (2006.01) | |
| C04B 22/06 | (2006.01) | |
| C04B 24/12 | (2006.01) | |
| H01L 23/29 | (2006.01) | |
| C04B 111/00 | (2006.01) | |

(52) U.S. Cl.
CPC .......... *C04B 22/165* (2013.01); *C04B 14/046* (2013.01); *C04B 14/06* (2013.01); *C04B 22/064* (2013.01); *C04B 22/066* (2013.01); *C04B 24/128* (2013.01); *H01L 23/29* (2013.01); *C04B 2111/00482* (2013.01); *C04B 2111/00844* (2013.01)

(58) Field of Classification Search
CPC ..... C04B 14/046; C04B 14/06; C04B 22/064; C04B 22/066; C04B 22/165; C04B 24/128; C04B 2111/00482; C04B 2111/00844; C04B 14/04; C04B 14/22; C04B 14/32; C04B 14/36; C04B 14/303; C04B 14/304; C04B 14/308; C04B 14/309; C04B 22/062; C04B 24/126; C04B 28/34; C04B 2111/00525; H01L 23/29; H01L 23/31
See application file for complete search history.

(56) References Cited

FOREIGN PATENT DOCUMENTS

| | | |
|---|---|---|
| EP | 1044942 A1 | 10/2000 |
| WO | 2015/193035 A1 | 12/2015 |

OTHER PUBLICATIONS

Int'l Search Report and Written Opinion dated May 28, 2018 in Int'l Application No. PCT/EP2018/055132, translation of Search Report only.

*Primary Examiner* — Anthony J Green
(74) *Attorney, Agent, or Firm* — Panitch Schwarze Belisario & Nadel LLP

(57) ABSTRACT

A composition consisting essentially of (a) 1 to 30% by weight of a 1 to 90% by weight aqueous phosphoric acid and/or a hydrogen phosphate; (b) 1 to 40% by weight of a compound selected from the group of oxides, hydroxides and oxide hydrates of magnesium, calcium, iron, zinc and copper; (c) 40 to 95% by weight of a particulate filler selected from the group of glass; mono-, oligo- and polyphosphates of magnesium, calcium, barium and aluminium; calcium sulphate; barium sulphate; simple and complex silicates; simple and complex aluminates; simple and complex titanates; simple and complex zirconates; zirconium dioxide; titanium dioxide, aluminium oxide; silicon oxide; silicon carbide; aluminium nitride; boron nitride and silicon nitride; (d) 1 to 10% by weight of an urea compound selected from the group consisting of imidazolidine-2-on, allantoin and imidazolidinyl urea; and (e) 0 to 15% by weight of a component differing from (a) to (d).

13 Claims, No Drawings

COMPOSITION FOR PRODUCING AN AQUEOUS COATING MASS

CROSS-REFERENCE TO RELATED APPLICATIONS

This application is a Section 371 of International Application No. PCT/EP2018/055132, filed Mar. 2, 2018, which was published in the German language on Feb. 7, 2019, under International Publication No. WO 2019/025033 A1, which claims priority under 35 U.S.C. § 119(b) to European Application No. 17183915.2, filed Jul. 31, 2017, and European Application No. 17200559.7, filed Nov. 8, 2017, the disclosures of each of which are incorporated herein by reference in their entireties.

The invention relates to a composition, which can be transferred into an aqueous hydraulically hardenable preparation, which can be used as coating material, by mixing, if necessary with water. The aqueous coating material can be used to produce a hydraulically hardened coating of an electronic component.

In addition to passive electronic components, the term "electronic component" used herein in particular comprises semiconductor modules and among the latter in particular power-electronic assemblies.

Semiconductor modules are understood herein as electronic or power-electronic assemblies comprising at least one substrate (as circuit carrier), at least one semiconductor module (semiconductor), as well as at least one passive electronic component, if applicable. The at least one semiconductor module itself can thereby already be partially or completely pre-coated, for example with an epoxy resin-based coating.

Examples for substrates are IMS substrates (insulated metal substrates), DCB substrates (direct copper bonded substrates), AMB substrates (active metal brazing substrates), ceramic substrates, metal ceramic substrates, PCBs (printed circuit boards) and leadframes.

Diodes, LEDs (light emitting diodes), dies (semiconductor chips), IGBTs (insulated-gate bipolar transistors, bipolar transistors comprising insulated gate electrode), ICs (integrated circuits), and MOSFETs (metal-oxide-semiconductor field-effect transistors) are examples for semiconductor modules. The semiconductor module or modules is/are in particular semiconductors, which develop significant heat during the normal operation as a result of thermal dissipation loss, i.e. which reach self-destructive temperatures of, for example 100 to >200° C. without coating and being unencapsulated.

Sensors, base plates, cooling elements, resistors, capacitors, transformers, throttles and coils are examples for passive electronic components.

The term "hydraulic hardening" used herein comprises a setting in the presence of water or after adding water, respectively.

Powdery compositions and aqueous coating materials, which can be produced therefrom, in the form of phosphate cement are disclosed for example in WO2015/193035 A1.

Coatings of electronic components made of such aqueous phosphate cement coating materials serve in particular for the electrical insulation and for the heat dissipation from the electronic component to the outside during the operation. The finished coating of aqueous hydraulically hardened coating material is to have a good adhesion to the surface or the surfaces of the respective electronic component, for example to the surfaces of the different components of a semiconductor module and thus to a variety of different material surfaces. Good flow properties of the aqueous coating material are important in this connection as condition for a tight contact with the component surfaces, as well as with regard to the processing and application properties of the aqueous coating material.

Surprisingly, it was shown and can be gathered form the following disclosure of the invention that the flow properties of aqueous phosphate cement coating materials improve unexpectedly by adding certain urea compounds in terms of a viscosity reduction. As a result of the improved flow behaviour, an improved adhesion of hydraulically hardened coatings, which are made of the aqueous phosphate cement coating materials with the addition, to the surfaces of electronic components coated therewith can be observed.

The invention relates to a composition consisting of the parts:

(a) 1 to 30% by weight of a 1 to 90% by weight aqueous phosphoric acid ($H_3PO_4$) and/or at least of one hydrogen phosphate selected from the group consisting of mono- and dihydrogen phosphates of sodium, potassium, ammonium, magnesium, calcium, aluminium, zinc, iron, cobalt and copper, (b) 1 to 40% by weight of at least one compound selected from the group consisting of oxides, hydroxides and oxide hydrates of magnesium, calcium, iron, zinc and copper, (c) 40 to 95% by weight of at least one particulate filler selected from the group consisting of glass; mono-, oligo- and polyphosphates of magnesium, calcium, barium and aluminium; calcium sulphate; barium sulphate; simple and complex silicates comprising sodium, potassium, calcium, aluminium, magnesium, iron and/or zirconium; simple and complex aluminates comprising sodium, potassium, calcium, magnesium and/or zirconium; simple and complex titanates comprising sodium, potassium, calcium, aluminium, magnesium, barium and/or zirconium; simple and complex zirconates comprising sodium, potassium, calcium, aluminium and/or magnesium; zirconium dioxide; titanium dioxide, aluminium oxide; silicon oxide; silicon carbide; aluminium nitride; boron nitride and silicon nitride, (d) 1 to 10% by weight of at least one urea compound selected from the group consisting of imidazolidine-2-on, allantoin and imidazolidinyl urea, and (e) 0 to 15% by weight of at least one component, which differs from the components (a) to (d).

Each of the components (a), (b), (c), (d) and (e) can comprise one or a plurality of different ingredients, subsequently also referred to as subcomponents. The component (a), which accounts for 1 to 30% by weight, preferably 2 to 15% by weight, of the composition according to the invention, is at least one substance selected from the group consisting of 1 to 90% by weight of aqueous phosphoric acid (aqueous solution consisting of 1 to 90% by weight of phosphoric acid and the proportion of water, 100% by weight which is missing), sodium monohydrogenphosphate, potassium monohydrogenphosphate, ammonium monohydrogenphosphate, magnesium monohydrogenphosphate, calcium monohydrogenphosphate, aluminium monohydrogenphosphate, zinc monohydrogenphosphate, iron monohydrogenphosphate, cobalt monohydrogenphosphate, copper monohydrogenphosphate, sodium dihydrogenphosphate, potassium dihydrogenphosphate, ammonium dihydrogenphosphate, magnesium dihydrogenphosphate, calcium dihydrogenphosphate, aluminium dihydrogenphosphate, zinc dihydrogenphosphate, iron dihydrogenphosphate, cobalt dihydrogenphosphate and copper dihydrogenphosphate. In other words, it is a 1 to 90% by weight aqueous phosphoric acid and/or at least one hydrogenphosphate selected from the group consisting of mono- and dihydrogenphosphates of sodium, potassium, ammonium, magnesium, calcium, aluminium, zinc, iron, cobalt and copper. In particular, it is at least one hydrogenphosphate selected from the group consisting of mono- and dihydrogenphosphates of magnesium, potassium, aluminium and ammonium.

In the case of the absence of phosphoric acid, the component (a) or the subcomponents thereof, respectively, are preferably solid particles, for example comprising particle sizes in the range of up to 1 mm.

The component (b), which accounts for 1 to 40% by weight, preferably 2 to 15% by weight, of the composition according to the invention, is at least one compound selected from the group consisting of oxides, hydroxides and oxide hydrates of magnesium, calcium, iron, zinc and copper, in particular at least one compound selected from the group consisting of magnesium oxide, iron oxide and calcium oxide. Magnesium oxide is particularly preferred.

The component (b) or the subcomponents thereof, is preferably a solid particle, for example comprising particle sizes in the range of up to 0.3 mm.

The component (c), which accounts for 40 to 95% by weight, preferably 65 to 90% by weight, of the composition according to the invention, is at least one particulate filler selected from the group consisting of glass; mono-, oligo- and polyphosphates of magnesium, calcium, barium and aluminium; calcium sulphate; barium sulphate; simple and complex silicates comprising sodium, potassium, calcium, aluminium, magnesium, iron and/or zirconium; simple and complex aluminates comprising sodium, potassium, calcium, magnesium and/or zirconium; simple and complex titanates comprising sodium, potassium, calcium, aluminium, magnesium, barium and/or zirconium; simple and complex zirconates comprising sodium, potassium, calcium, aluminium and/or magnesium; zirconium dioxide; titanium dioxide; aluminium oxide; silicon dioxide, in particular in the form of silicic acid and quartz; silicon carbide; aluminium nitride; boron nitride and silicon nitride. Zirconium silicate, silicic acid and quartz are preferred.

The above paragraph mentions mono-, oligo- and polyphosphates; to avoid misunderstandings, they are hydrogen-free phosphates, in contrast to the hydrogenphosphates of the component (a).

A differentiation is in each case made in the above paragraph between simple and complex silicates, aluminates, titanates and zirconates. The complex representatives are not complex compounds, but this does in fact refer to silicates, aluminates, titanates and zirconates comprising more than one type of cations, such as, for example sodium aluminium silicate, calcium aluminium silicate, lead zirconate titanate, etc.

The particle sizes of component (c) or of the subcomponents thereof, respectively, are in the range of, for example, between 20 nm and 0.3 mm or even of between 20 nm and 1 mm.

The component (d), which accounts for 1 to 10% by weight, preferably 3 to 8% by weight, of the composition according to the invention, is at least one urea composition selected from the group consisting of imidazolidine-2-on, allantoin and imidazolidinyl urea, preferably in the form of solid particles, for example comprising particle sizes in the range of up to 1 mm. Imidazolidine-2-on is preferred.

The component (e), which accounts for 0 to 15% by weight, preferably 0 to 8% by weight, or 2 to 8% by weight, of the composition according to the invention, is at least one or a plurality of components, which differ from the components (a) to (d). Examples comprise in particular additives, such as setting retarders (work life extenders), defoamers, wetting agents and adhesion promoters.

The component (e) or the subcomponents thereof, respectively, are preferably solid particles, for example comprising particle sizes in the range of up to 0.3 mm or even of up to 1 mm. It is possible that the component (e) is not solid, but liquid, for example, or comprises non-solid, for example liquid subcomponents.

The following table illustrates several examples of preferred embodiments of compositions according to the invention.

| Component | Embodiment 1 | Embodiment 2 | Embodiment 3 |
| --- | --- | --- | --- |
| (a), in particular potassium and/or aluminium dihydrogen-phosphate | 3-9% by weight | 6-12% by weight | 12-23% by weight |
| (b), in particular magnesium oxide | 3-8% by weight | 5-14% by weight | 8-19% by weight |
| (c), in particular zirconium silicate | 70-90% by weight | 55-80% by weight | 45-65% by weight |
| (d), in particular imidazolidine-2-on | 3-7% by weight | 4-8% by weight | 5-10% by weight |
| (e) | 0-6% by weight | 5-11% by weight | 8-15% by weight |

The composition according to the invention consists of the components (a) to (e), i.e. the % by weight portions of the components (a) to (e) add up to 100% by weight of the composition according to the invention. If no component (e) is included, the % by weight portions of the components (a) to (d) add up to 100% by weight of the composition according to the invention.

The composition according to the invention, which comprises the components (a) to (d) or (a) to (e), respectively, can be provided as single-component mixture, i.e. as completely prepared composition. If component (a) comprises phosphoric acid thereby, such a single-component composition according to the invention can only be stored for a short period of time, for example only for up to 2 hours. With the exception of single-component compositions according to the invention, comprising a component (a), which comprises phosphoric acid, single-component compositions according to the invention are preferably provided in particulate form, for example in powder form.

In the single-component particulate composition according to the invention, the components (a) to (d) or (a) to (e), respectively, are present so as to be mixed intimately with one another, in particular as stochastically homogenous mixture. The single-component particulate composition preferably does not display a clump formation and is free-flowing.

As an alternative to the provision of the composition according to the invention as single-component system, it can be advantageous to provide the composition according to the invention as two- or multi-component system, for example in the case of a composition according to the invention comprising a component (a), which comprises phosphoric acid.

To prevent mix-ups, a differentiation is made herein between components (a) to (e), subcomponents of these components, and components of the two- or multi-component system.

If component (a) comprises phosphoric acid, the components (a) to (e) or subcomponents thereof, respectively, could be distributed arbitrarily to the components of the composition according to the invention, which is provided as two- or multi-components, provided that the components (a) and (b) are present separately from one another.

The components of the two- or multi-component system are preferably present in a provision quantity, which corresponds to the above-mentioned proportion of the components (a) to (d) or (a) to (e), respectively, in other words in a ready-portioned manner and so as to thus be capable of being mixed directly with one another into the composition according to the invention without weighing or measuring. If component (a) comprises phosphoric acid thereby, such a single-component composition according to the invention can only be stored for a short period of time, as mentioned above.

With the exception of components comprising phosphoric acid, the separate two or more components, which are to be mixed with one another and, if necessary, with separately provided water, for the purpose of preparing the completed composition according to the invention, are preferably provided in particulate form, for example in powder form. Particulate or powdery components of the two- or multi-component system, which comprise more than one, thus two or more different components and/or subcomponents, are thereby present as intimate mixture, in particular as stochastically homogenous mixture; such particulate components preferably do not show a clump formation and are free-flowing.

Both the particulate single-component composition according to the invention and the particulate components of the composition according to the invention, which is provided as two- or multi-component composition, can be produced according to methods for producing free-flowing particulate compositions, which are known to the person of skill in the art. By way of example, tumble mixing, intensive mixing, dry grinding and air blending are mentioned as production methods.

As mentioned above, the invention also relates to an aqueous hydraulically hardenable preparation, which can be used as coating material. In general, an aqueous hydraulically hardenable preparation of the type in question does not include an excess of acid; in other words, the alkaline component (b) can be dimensioned according to type and quantity in such a way that the acid equivalent provided by component (a) as well as possible further acid equivalents can be completely neutralized from the components (c) and (e), preferably over-neutralized.

In some embodiments, the composition according to the invention can be or can represent, respectively, an aqueous hydraulically hardenable preparation in the above-mentioned sense per se, i.e. this is then a composition according to the invention, which does not require, or which no longer requires a mixing with separately provided water. Examples are those embodiments of compositions according to the invention, which are provided as single-component composition, comprising a component (a), which comprises a correspondingly large quantity of an aqueous phosphoric acid of low concentration. The same applies in the case of compositions according to the invention, which are provided as two- or multi-component compositions, comprising such a component (a), i.e. a respective composition according to the invention, which is produced by mixing the two or more components, can directly be or can represent, respectively, an aqueous hydraulically hardenable preparation in the above-mentioned sense per se, if applicable, without requiring a mixing with separately provided water.

In another embodiments, in contrast, the addition of or the mixing with separately provided water, respectively is required. Examples are in particular compositions according to the invention comprising a phosphoric acid-free component (a). Further examples are compositions according to the invention comprising a component (a), which does comprise phosphoric acid, but simultaneously only little water. The composition according to the invention can be mixed here with separately provided water to form an aqueous hydraulically hardenable preparation.

Required or non-required mixing with separately provided water is mentioned herein several times. The mixing with separately provided water is in particular required, when the totality of the components of the composition according to the invention does not comprise any or too little water, so as to get to an aqueous hydraulically hardenable preparation, which can be used as aqueous coating material, comprising an initial viscosity of for example in the range of between 2 and 25 Pa·s, as product of the mixing of all components without the addition of separately provided water. The term of the initial viscosity as well as the purpose thereof will be explained below.

For example, 100 parts by weight of the single-component and preferably particulate composition according to the invention can be mixed with between 5 and 30 parts by weight, preferably between 6 and 15 parts by weight of water.

In response to the production of the aqueous hydraulically hardenable preparation using the composition according to the invention, which is provided as two- or multi-component composition, the individual components thereof and the water, which is provided separately, if required, can be mixed with one another in any order, if necessary also in portions. It goes without saying that if separately provided water is added, a totality of a desired proportion of composition according to the invention and water has to be maintained, for example the above-mentioned proportion of 100 parts by weight of the composition according to the invention: between 5 and 30, preferably between 6 and 15 parts by weight of water. It is possible thereby to initially produce intermediate products in the form of premixtures of two or more components without water and/or of one or more components with water. The aqueous premixtures can be aqueous solutions, if applicable, for example aqueous solutions of the components (a), (d) or (e) or possible subcomponents thereof. It may be advantageous to produce aqueous premixtures with the component (b) and at least one acidic component or subcomponent, respectively (forming $H_3O+$ ions in the presence of water), selected from the components (a), (c), and (e) or subcomponents thereof, respectively, for no longer than for example up to 24 hours prior to the final mixing to the aqueous hydraulically hardenable preparation. The same applies for component (b) or aqueous premixtures comprising subcomponents of component (b), but which are free from acidic components or subcomponents; it is advantageous here not to produce such premixtures more than for example up to 48 hours prior to the final mixing to the aqueous hydraulically hardenable preparation.

Stirring and intensive mixing, for example intensive mixing using planetary mixers are examples for mixing methods, which can be used in response to the final mixing to aqueous hydraulically hardenable preparation using the two- or multi-component composition according to the invention.

The aqueous hydraulically hardenable preparation, which can be obtained in response to the mixing of the one- or multi-component composition according to the invention with or, if not required, without the use of separately provided water, is characterized by a flowability, which is good initially and during a processing period (work life) of for example up to one hour, which, by nature, decreases in the course of the hydraulic hardening. The flowability can be determined, for example expressed as initial viscosity.

The initial viscosity can be measured, for example, by means of rotational viscometry (measuring conditions: plate/plate measuring principle, plate diameter 25 mm, measuring gap 1 mm, sample temperature 20° C., constant shear rate 36 min$^{-1}$, determination of the viscosity value after a measuring time of 2 minutes). Due to the fact that it is routinely possible to mix the composition according to the invention with the water to a homogenous aqueous hydraulically hardenable preparation within 5 minutes, and to prepare it for the viscosity measurement, the initial viscosity is measured after 5 minutes, starting with bringing the composition according to the invention and water into first contact, or, if a mixing with separately provided water is not required, after finalizing the composition according to the invention, which already represents the aqueous hydraulically hardenable preparation per se. Initial viscosities measured in this way without the addition of the at least one urea compound (d) lie for example in the range of between 15 and 50 Pa·s. In the case of the addition according to the invention of the at least one urea compound (d), it is lower, for example in the range of between 2 and 25 Pas.

The aqueous, free-flowing and hydraulically hardenable preparation can be used as aqueous coating material for electronic components. For the sake of brevity, the term "aqueous coating material" will be used hereinafter.

The aqueous coating material can be used to produce a hydraulically hardened coating of electronic components. The production method comprises the steps:

(1) providing an electronic component, which is to be coated,
(2) providing an aqueous coating material, which is produced as mentioned above,
(3) coating the electronic component, which is produced in step (1), with the aqueous coating material provided in step (2), and
(4) hydraulic hardening of the aqueous coating material, which coats the electronic component after completion of step (3).

In step (1), an electronic component, which is to be coated, is provided, for example a passive electronic component or a semiconductor module, the latter in particular in the form of a power-electronic assembly.

With regard to step (2), reference is made to the statements above.

Step (3) is preferably performed immediately, for example within 60 minutes, preferably within 10 minutes after completion of step (2).

In step (3), the electronic component provided in step (1) is coated with the aqueous coating material provided according to step (2).

Preferred application methods are casting, immersion and injection moulding. The casting can take place by means of common methods, which are known to the person of skill in the art, for example by means of gravity, pressure-supported or pressure-reduced casting. It may be advantageous thereby to surround the electronic component, which is to be coated, with half shell forms and to then fill it with the free-flowing coating material. The coating can take place as partial or complete coating. In response to the coating of a semiconductor module, for example, work can be performed in such a way that the coating material either partially or completely coats electric contacting elements, such as for example bonding wires, small tapes and/or a substrate, which are connected to the semiconductor module. Partial coating thereby means that one or a plurality of the contacting elements are coated incompletely and/or one or a plurality of the contacting elements are not coated, while complete coating means that all contacting elements are coated completely. However, the casting can for example also take place in such a way that the coating material is embodied as "glob-top", which is known to the person of skill in the art.

In step (4), which follows step (3), the aqueous coating material, which coats the electronic component, is hardened hydraulically. More specifically, the essential part of the hydraulic hardening takes place up to the setting in step (4); it goes without saying that the hydraulic hardening has already started at that moment, at which the components (a) and (b) have come into contact with one another in the presence of water, i.e. already in the course of step (2). A drying in terms of a removal of water or of the water, respectively, can take place during and after the actual setting. Setting and drying can take place for example for 30 to 300 minutes in a temperature range of for example between 20 and 300° C.

In the event that half shell forms are used in step (3), the coated electronic component can be removed from the half shells after the hydraulic hardening according to step (4) and opening of said half shells.

The invention also relates to an electronic component, which is coated according to the method comprising steps (1) to (4).

EXAMPLES

General Performance

The powdery solid compositions described in the table below were weighed in a cup comprising a screw cap. After closing the cup, the respective composition was homogenized manually by means of shaking and was then added to water stored in a second cup and was homogenized within 5 minutes by means of intensive stirring. The mixing ratio was in each case 100 parts by weight of solid composition: 10 parts by weight of water. The aqueous preparation obtained in this way was added into the measuring cell of a rheometer and the respective initial viscosity was determined according to the corresponding statements in the preceding description.

| Example Components: | 1 | 2 | 3 |
|---|---|---|---|
| | Parts by weight in g | | |
| (a) Potassium hydrogenphosphate | 4.6 | 4.6 | 4.6 |
| (b) Magnesium oxide $D_{50}$ = 18 μm | 3.8 | 3.8 | 3.8 |
| (c) Zirconium silicate $D_{50}$ = 10 μm | 48.8 | 48.8 | 48.8 |
| (d) Imidazolidine-2-on | 0 | 2.5 | 5.2 |
| Initial viscosity [Pa · s] | 26.2 | 12.4 | 6.6 |

$D_{50}$ = average particle diameter

The effect of the addition of imidazolidine-2-on, which improves the flowability, can be seen directly from the initial viscosities, which are determined for Examples 1 to 3.

The invention claimed is:
1. A composition comprising the parts:
(a) 1 to 30% by weight of a 1 to 90% by weight aqueous phosphoric acid and/or at least of one hydrogen phosphate selected from the group consisting of mono- and dihydrogen phosphates of sodium, potassium, ammonium, magnesium, calcium, aluminium, zinc, iron, cobalt and copper,

(b) 1 to 40% by weight of at least one compound selected from the group consisting of oxides, hydroxides and oxide hydrates of magnesium, calcium, iron, zinc and copper, (c) 40 to 95% by weight of at least one particulate filler selected from the group consisting of glass; mono-, oligo- and polyphosphates of magnesium, calcium, barium and aluminium; calcium sulphate; barium sulphate; simple and complex silicates comprising sodium, potassium, calcium, aluminium, magnesium, iron and/or zirconium; simple and complex aluminates comprising sodium, potassium, calcium, magnesium and/or zirconium; simple and complex titanates comprising sodium, potassium, calcium, aluminium, magnesium, barium and/or zirconium; simple and complex zirconates comprising sodium, potassium, calcium, aluminium and/or magnesium; zirconium dioxide; titanium dioxide, aluminium oxide; silicon oxide; silicon carbide; aluminium nitride; boron nitride and silicon nitride, (d) 1 to 10% by weight of at least one urea compound selected from the group consisting of imidazolidine-2-on, allantoin and imidazolidinyl urea, and (e) 0 to 15% by weight of at least one component, which differs from the components (a) to (d).

2. The composition according to claim 1, whereby the component (a) is at least one hydrogenphosphate selected from the group consisting of mono- and dihydrogenphosphates of magnesium, potassium, aluminium and ammonium.

3. The composition according to claim 1, whereby the component (b) is at least one compound selected from the group consisting of magnesium oxide, iron oxide and calcium oxide.

4. The composition according to claim 1, whereby component (c) is at least one particulate filler selected from the group consisting of zirconium silicate, silicic acid and quartz.

5. The composition according to claim 1, whereby component (d) is imidazolidine-2-on.

6. The composition according to claim 1 in the form of a single-component mixture or of a two- or multi-component system.

7. An aqueous hydraulically hardenable preparation producible by mixing a composition according to claim 1 with water.

8. The aqueous hydraulically hardenable preparation according to claim 7, whereby the mixing ratio is 100 parts by weight of the composition and between 5 and 30 parts by weight of water.

9. An aqueous hydraulically hardenable preparation comprising the composition according to claim 1, as aqueous coating material for electronic components.

10. A method for producing a hydraulically hardened coating of an electronic component, comprising the steps:
    (1) providing an electronic component, which is to be coated,
    (2) providing an aqueous coating material in the form of an aqueous hydraulically hardenable preparation according to claim 7, which does not require a mixing with separately provided water,
    (3) coating the electronic component, which is produced in step (1), with the aqueous coating material provided in step (2), and
    (4) hydraulic hardening of the aqueous coating material, which coats the electronic component after completion of step (3).

11. The method according to claim 10, whereby the electronic component, which is to be coated, is a passive electronic component or a semiconductor module.

12. An electronic component coated by the method according to claim 10.

13. A method for producing a hydraulically hardened coating of an electronic component, comprising the steps:
    (1) providing an electronic component, which is to be coated,
    (2) providing a composition according to claim 1, which does not require a mixing with separately provided water,
    (3) coating the electronic component, which is produced in step (1), with the aqueous coating material provided in step (2), and
    (4) hydraulic hardening of the aqueous coating material, which coats the electronic component after completion of step (3).

* * * * *